(12) United States Patent
Kaneko et al.

(10) Patent No.: US 6,661,939 B2
(45) Date of Patent: Dec. 9, 2003

(54) OPTICAL MODULE AND METHOD FOR MANUFACTURING SAME

(75) Inventors: Katsuhiro Kaneko, Kyoto (JP); Shigeo Tanahashi, Kyoto (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/962,171

(22) Filed: Sep. 24, 2001

(65) Prior Publication Data

US 2002/0037138 A1 Mar. 28, 2002

(30) Foreign Application Priority Data

Sep. 26, 2000 (JP) ..................................... P2000-292273

(51) Int. Cl.[7] ................................................ G02B 6/12
(52) U.S. Cl. ............................. 385/14; 385/92; 385/129
(58) Field of Search .......................... 385/14, 88, 89, 385/92, 129, 130, 131, 132

(56) References Cited

U.S. PATENT DOCUMENTS

| | | | |
|---|---|---|---|
| 4,712,854 A | * 12/1987 | Mikami et al. | ............. 385/143 |
| 5,448,055 A | * 9/1995 | Nakamura et al. | ........ 250/208.1 |
| 5,581,646 A | * 12/1996 | Tsukamoto et al. | ........... 385/96 |
| 6,455,878 B1 | * 9/2002 | Bhat et al. | ..................... 257/99 |

FOREIGN PATENT DOCUMENTS

| | | |
|---|---|---|
| JP | 07-183570 | 7/1995 |
| JP | 11-183761 | 7/1999 |

OTHER PUBLICATIONS

Manabu Kagami, et al., "Proposal about simple optical module using self–forming optical waveguide", Collection of Papers for the 14th Academic Conference on Electronics Mounting, Mar. 15–17, 2000, Japan, pp. 229–230.

* cited by examiner

Primary Examiner—Audrey Chang
Assistant Examiner—Denise S. Allen
(74) Attorney, Agent, or Firm—Hogan & Hartson

(57) ABSTRACT

An optical module comprising: an optical element flip-chip mounted on a substrate; an optical waveguide formed on the substrate and optically connected to the optical element; and underfill resin filled in between the substrate and the optical element and covering an optical junction between the optical element and the optical waveguide, wherein the underfill resin is of an electrically insulating material and has a refractive index equal to or smaller than a refractive index of a clad portion of the optical waveguide. The optical element can be flip-chip mounted with improved mechanical and electrical mounting reliability and thus satisfactory optical connection can be maintained. Further, it never occurs that light passing through the optical waveguide leaks to the underfill resin in the optical junction between the optical waveguide and the optical element.

12 Claims, 3 Drawing Sheets

OPTICAL MODULE AND METHOD FOR MANUFACTURING SAME

BACKGROUND OF THE INVENTION

1. Field of the Invention

The present invention relates to an optical module for use in optical communication modules or the like, more particularly to an optical module obtained by flip-chip mounting a surface-operating optical element on an electric circuit substrate having an optical waveguide formed thereon and filling underfill resin in between the optical element and the substrate, wherein the electrical, optical, and mechanical mounting reliability of the optical element is successfully improved and a method for manufacturing such an optical module.

2. Description of the Related Art

As a method for mounting a semiconductor element on an electric circuit substrate, there has conventionally been known a so-called flip-chip mounting method whereby a semiconductor element is mounted via a conductor bump on an electric circuit substrate. Generally, in the flip-chip mounting, after an electric circuit substrate and a semiconductor element are electrically connected and fixed to each other via a conductor bump, such a solder bump, underfill resin is filled in between the electric circuit substrate and the semiconductor element. By doing so, the bump-connected portion between the electric circuit substrate and the semiconductor element is sealed, and the other portions thereof are fixed to each other, so that the mechanical and electrical mounting reliability improve.

Meanwhile, the flip-chip mounting is adopted for mounting an optical element. For example, in the construction proposed in Japanese Unexamined Patent Publication JP-A 7-183570 (1995), as shown in FIG. 3 in section, a compound semiconductor chip 22 including a light-emitting element 25 and a silicon semiconductor chip 23 including a light-receiving element 26 are each mechanically and electrically connected to a silicon substrate 21 via a gold-made conductor bump 24. According to this proposal, the light emitted from the light-emitting element 25 is introduced into an optical waveguide 27, and then has its traveling direction changed by a reflecting surface 28 so as to enter the light-receiving element 26.

Also in a case where an optical element is flip-chip mounted, to attain sufficiently high mechanical and electrical mounting reliability, it is preferable that underfill resin is filled in between the optical element and the mounting substrate. Moreover, if there exists a gap between the optical element and the mounting substrate, there is the possibility of accidental intrusion of foreign material between the optical element and the mounting substrate, which is detrimental to establishment of optical connection. To avoid this, it is preferable to fill underfill resin in between the optical element and the mounting substrate.

However, in the case where underfill resin is filled in between the optical element and the mounting substrate having an optical waveguide formed thereon, not only it is necessary to achieve improvement in mechanical and electrical mounting reliability as conventionally intended, but it is also necessary to transmit light between the optical element and the optical waveguide with efficiency. Specifically, although it is needless to say that the underfill resin needs to exhibit light transmittability, in a case where, in the optical waveguide, the upper clad portion covering the core portion is made thin, if the refractive index of the underfill resin covering the upper clad portion is larger than the refractive index of the upper clad portion, specific light, which is basically guidedly transmitted through the optical waveguide while being trapped in the core portion having a refractive index larger than that of the clad portion, inconveniently leaks to the underfill resin arranged on the outer side of the clad portion. This makes it impossible to achieve proper light transmission.

Moreover, light leakage usually occurs between the optical waveguide and the optical element to one degree or another. In this connection, a so-called multichip module obtained by mounting a plurality of optical element chips on a single substrate faces a problem in that such leakage of light becomes stray light and couples with another optical element or optical waveguide to cause crosstalk.

SUMMARY OF THE INVENTION

The present invention has been made to solve the above stated problems with the conventional art, and has its object to provide an optical module obtained by flip-chip mounting an optical element face-down on a substrate having an optical waveguide formed thereon, and thereafter filling underfill resin in between the substrate on which the optical waveguide is formed and the optical element, wherein the mechanical, electrical, and optical mounting reliability of the optical element is successfully improved.

The invention provides an optical module comprising:

a substrate having an electric circuit formed thereon;

a surface light receiving optical element or surface light emitting optical element flip-chip mounted on the substrate with its light-receiving surface or light-emitting surface facing the substrate side;

an optical waveguide formed on the substrate, the optical waveguide having a core portion and a clad portion optically connected to the surface light receiving optical element or the surface light emitting optical element; and underfill resin filled in between the substrate and the light-receiving surface or between the substrate and the light-emitting surface, the underfill resin covering an optical junction between the surface light receiving optical element or the surface light emitting optical element and the optical waveguide, wherein the underfill resin is an electrically insulating material and has a refractive index equal to or smaller than a refractive index of the clad portion of the optical waveguide.

The invention further provides a method for manufacturing an optical module comprising the steps of:

forming an optical waveguide having a core portion and a clad portion on a substrate on which an electric circuit is formed;

flip-chip mounting a surface light receiving optical element or a surface light emitting optical element on the substrate with its light-receiving or light-emitting surface facing the substrate side; and filling and curing an underfill resin of an electrically insulating material and having a refractive index equal to or smaller than a refractive index of the clad portion of the optical waveguide, in between the substrate and the light-receiving surface or between the substrate and the light-emitting surface.

According to the invention, the underfill resin, which is filled in between the light-receiving surface of the surface light receiving optical element (or the light-emitting surface of the surface light emitting optical element) flip-chip mounted on the substrate having an electric circuit formed thereon and the substrate, and covers the optical junction between the surface light receiving optical element (or the surface light emitting optical element) and the optical waveguide formed on the substrate, is of an electrically insulating material and has a refractive index equal to or smaller than the refractive index of the clad portion of the optical waveguide. Thus, the optical element can be flip-chip mounted with improved mechanical and electrical mounting reliability. Moreover, since there is no possibility of accidental intrusion of foreign material between the optical element and the mounting substrate, satisfactory optical connection can be maintained. Further, even in a case where, for example, the upper clad portion of the optical waveguide covering the core portion is made thin, it never occurs that light which is guidedly transmitted through the optical waveguide while being trapped in the core portion of the optical waveguide leaks to the underfill resin arranged on the outer side of the clad portion in the optical junction between the path and the optical element. This allows satisfactory light transmission between the optical element and the optical waveguide.

In the invention, it is preferable that, in the above stated construction, the underfill resin is of the type that its refractive index is increased by irradiation with light and has an optical guide structure formed by making the refractive index of a pathway irradiated with light coming from the optical waveguide side smaller than the refractive index of a periphery thereof.

Moreover, according to the invention, in a case where the underfill resin in use is of the type that its refractive index is increased by irradiation with light and is provided with an optical guide structure formed by making the refractive index of the pathway radiated with light coming from the optical waveguide side smaller than the refractive index of the periphery thereof, the light connected between the optical waveguide and the optical element is trapped within the optical guide structure and is thereby prevented from leaking outside of the optical guide structure. This makes it possible to effectively suppress occurrence of stray light which causes crosstalk in optical signals.

In the invention, it is preferable that, in the above stated construction, the underfill resin is of the type that its light transmittability is increased by irradiation with light, and has an optical guide structure formed by making the light transmittability of a pathway irradiated with light coming from the optical waveguide side smaller than the light transmittability of a periphery thereof.

Moreover, according to the invention, in a case where the underfill resin is of the type that its light transmittability is increased by irradiation with light and has an optical guide structure formed by making the light transmittability of the pathway irradiated with light coming from the optical waveguide side smaller than the light transmittability of the periphery thereof, when the light connected between the optical waveguide and the optical element leaks to the outside of the optical guide structure, the leakage light is attenuated by dint of the underfill resin in which the light transmittability of its portion outside the optical guide structure is low. This makes it possible to effectively suppress occurrence of stray light which causes crosstalk in optical signals.

In the invention, it is preferable that the underfill resin comprises an elastomer resin, polyimide resin, epoxy resin, silicone resin, urethane resin, acrylic resin, fluorine resin, polyolefine resin, and any other polymer resin.

In the invention, it is preferable that the underfill resin comprises a resin material in which at least a matrix contains a photopolymerization monomer and a photopolymerization accelerator.

In the invention, it is preferable that the underfill resin comprises a resin material containing a monomer or oligomer with an organic component attached thereto as a terminal group and a photopolymerization accelerator, which resin material is polymerized with dehydration or dealcoholization by irradiation with light.

As described heretofore, according to the invention, there are provided an optical module and a method for manufacturing the same, the optical module being obtained by flip-chip mounting an optical element face-down on a substrate having an optical waveguide formed thereon, and thereafter filling underfill resin in between the substrate on which the optical waveguide is formed and the optical element, wherein the mechanical, electrical, and optical mounting reliability of the optical element improves.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
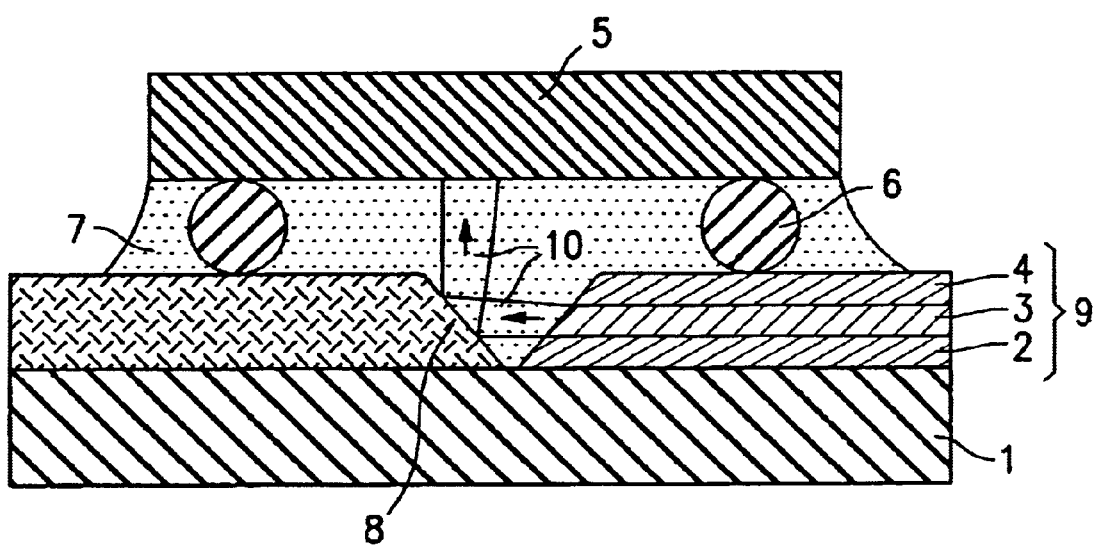
FIG. 1 is a sectional view showing one example of the embodiment of the optical module of the invention.

Now referring to the drawings, preferred embodiments of the invention are described below.

FIG. 1 is a sectional view showing one example of the embodiment of the optical module of the invention. In FIG. 1, the optical module includes: a substrate 1; an optical waveguide 9; an optical element 5; a conductor bump 6; underfill resin 7; and a mirror portion 8. The substrate 1 has an electric circuit formed thereon. The optical waveguide 9 includes: a lower clad portion 2; a core portion 3; and an upper clad portion 4. In the invention, the clad portion of the optical waveguide 9 consists of the lower clad portion 2 and the upper clad portion 4. The lower clad portion 2 is formed on the substrate 1. The core portion 3 is formed on the lower clad portion 2. The upper clad portion 4 is so formed as to cover the core portion 3.

The optical element 5 is of a surface light receiving or surface light emitting optical element. The conductor bump 6 provides electrical and mechanical connection between the electric circuit of the substrate 1 and the optical element 5. The underfill resin 7 is filled in between the substrate 1 and the optical element 5. The mirror portion 8 serves to change a traveling direction of light for the purpose of providing optical connection between the optical waveguide 9 and the optical element 5. In the optical waveguide 9, the core portion 3 has its one end optically connected to an optical fiber or a photoelectric conversion element, or other (not shown) used for optical signal transmission/reception with respect to an external circuit.

On the substrate 1 is formed a photoelectricity circuit which includes the electric circuit as well as the optical waveguide 9. Moreover, the substrate 1 functions as a supporting substrate on which the optical element 5 is mounted. As the substrate 1 in question, it is possible to use various substrates designed to deal with optical signals, for example, an optical integrated circuit substrate, or an opto-electronic substrate. The examples thereof includes: a silicon substrate; an alumina substrate; a glass ceramic substrate; a multi-layer ceramic substrate; and a plastic electric wiring substrate.

The optical waveguide 9 formed on the substrate 1 is built as a three-dimensional waveguide in which the core portion 3 is sandwiched between the clad portions 2 and 4. The examples of the materials used therefore include: PMMA (polymethylmethaacrylate) resin; polycarbonate resin; polyimide resin; polysiloxane resin; BCB (benzocyclobutene) resin; and fluorineresin. Alternatively, an inorganic material, such as silica or lithium niobate may be used for the optical waveguide.

The optical waveguide 9 is formed as follows. Firstly, the lower clad portion 2 is formed on the substrate 1 in the following manner. In a case where an organic material is used, an organic solvent solution of an organic material, such as PMMA resin, polycarbonate resin, polyimide resin, polysiloxane resin, BCB resin, or fluorine resin, is applied to the substrate 1 in a predetermined thickness by means of spin-coat method or other, and subsequently heating treatment is performed.

Secondly, the core portion 3 is formed on the lower clad portion 2 in the following manner. An organic solvent solution of an organic material, such as PMMA resin, polycarbonate resin, polyimide resin, polysiloxane resin, BCB resin, or fluorine resin, is applied to the substrate 1 in a predetermined thickness by means of spin-coat method or other, and subsequently heating treatment is performed. Thereafter, the core portion 3 thus obtained is formed into a predetermined shape by means of a known fine-processing technique, such as photolithography or RIE (reaction ion etching). Note that the core portion 3 is made of a material having a refractive index higher than that of the material used for the lower clad portion 2.

Lastly, after the formation of the core portion 3, the upper clad portion 4 is formed in the following manner so as to cover the core portion 3. An organic solvent solution of an organic material, such as PMMA resin, polycarbonate resin, polyimide resin, polysiloxane resin, BCB resin, or fluorine resin, is applied to the substrate 1 in a predetermined thickness by means of spin-coat method or other, and subsequently heating treatment is performed.

Here, the height, the width, and the refractive index of the core portion 3; the thickness and the refractive index of the lower clad portion 2; and the thickness and the refractive index of the upper clad portion 4 are arbitrarily determined based on known theory of an optical waveguide.

In such manners as described above, the three-dimensional waveguide 9 is realized in which the core portion 3 is embedded between the clad portions 2 and 4.

The optical element 5 is of a surface light receiving optical element or a surface light emitting optical element. The examples of the surface light receiving optical element 5 include: pn photodiode formed with use of a semiconductor material such as Si, Ge, InP, GaAs, InAs, or InGaAsP; pin photodiode; phototransistor; MSM (Metal-Semiconductor-Metal) photodiode; and avalanche photodiode. On the other hand, the examples of the surface light emitting optical element 5 include: surface light emitting LED formed from a semiconductor material such as AlGaAs, GaAs, GaInAsP, or Inp; a surface light emitting laser of a vertical cavity type; and a surface light emitting laser composed of a horizontal cavity or a curved cavity and a diffraction grating or a reflecting mirror for converting an optical path. It is also possible to use OEIC (Opto-Electronic Integrated Circuit) or the like in which such an optical element 5 is described above, an optical element driving IC, and others are monolithically or hybridly integrated.

The conductor bump 6 is made of a known bump material used for flip-chip connection, for example, Au, AuSn, AuGe, SnPb, or InPb. The conductor bump 6 is electrically and mechanically connected to an electric circuit (not shown) formed on the substrate 1. Although, in FIG. 1, the conductor bump 6 is disposed on the surface of the optical waveguide, it may also be disposed immediately on the substrate 1. Note that the shape, the size, and the forming method of the conductor bump 6 may be determined in adherence to those adopted in commonly-used flip-chip mounting techniques.

The mirror portion 8 obtained by creating a slant surface on the substrate 1 by cutting or etching prior to forming the optical waveguide 9, and then coating the slant surface with a high-reflection metal film or the like, or obtained by, as disclosed in Japanese Unexamined Patent Publication JP-A 11-183761 (1999), forming the optical waveguide 9 and thereafter creating a slant surface thereon by cutting, dry-etching, or laser abrasion, and then coating the slant surface with a high-reflection metal film or the like. It is also possible to form a grating mirror by using a relief-type grating or a gradient-index grating.

The underfill resin 7 is filled in between the substrate 1 and the optical element 5 and is so arranged as to cover the optical junction between the optical element 5 and the optical waveguide 9.

The underfill resin 7 comprises a matrix polymer containing an elastomer resin, polyimide resin, epoxy resin, silicone resin, urethane resin, acrylic resin, fluorine resin, polyolefine resin, or any other polymer resin. Of these resin materials, electrically insulating one is used that has a refractive index value equal to or smaller than the refractive index value of the material used for the upper clad portion 4 of the optical waveguide, which is covered by the underfill resin. Here, an epoxy resin, a silicone resin and a fluorine resin are particularly suitable for use as the underfill resin 7 employed in the invention, because they exhibit sufficiently high insulation, have smaller refractive indices, and are highly moisture-resistant.

In order for the underfill resin 7 to be filled in between the substrate 1 and the light-receiving surface (or light-emitting surface) of the optical element 5, for example, an organic solvent solution of the above-mentioned resin or an organic solvent solution of a precursor thereof is adjusted to have a desired consistency so as to obtain an adequate flowability. Then, the solution is poured onto the substrate 1 around the optical element 5 flip-chip mounted thereon so as to flow under the optical element 5, or is poured into a hole, which is formed in the substrate 1 in advance so as to be located below the optical element 5, to be filled in between the optical element 5 and the substrate 1. Subsequently, the resin is cured by heating, irradiation with light, or other treatment.

Note that, in order to realize the underfill resin 7 having the property that its refractive index is increased by irradiation with light, a material which undergoes cross-link polymerization by irradiation with light, or a material having the tendency that its refractive index is increased with variations in its material structure due to color center formation or the like.

As such a material, a resin material may be used that includes an epoxy resin or polycarbonate resin as a matrix polymer material, containing a photopolymerization monomer (e.g., methylacrylate, ethylacrylate, acrylic acid, or trifluoroethylacrylate), a photopolymerization accelerator, and a sensitizer. An organic solvent solution of such a resin material is filled in a gap between the optical element 5 and the substrate 1, and then light is applied to a predetermined portion of the material to polymerize the photopolymerization monomer contained. Thereafter, by performing heating treatment, residual resin is cured by drying while unreacted portions of the monomer are removed. In this way, desirable underfill resin 7 can be realized in which the refractive index of the residual portion of the polymerized photopolymerization monomer is large relative to the refractive index of the periphery thereof free of unreacted monomer.

For the underfill resin 7, it is also possible to use instead an epoxy, silicone, or acrylic organic monomer, oligomer or polymer with photopolymerization initiator added thereto. In particular, the monomer and oligomer are suitable, because a solution thereof can permeate thoroughly between the optical element 5 and the substrate 1 simply by adjusting its viscosity to the desired level.

For example, in the case where an epoxy oligomer is used as the underfill resin 7, an epoxy group or alkoxy group is cross-linked with a hydroxyl group included in the epoxy oligomer by irradiation with light, and then heating treatment is performed to decompose and remove unreacted portions of the photopolymerization initiator and the solvent, so that the resin is cured by drying. As a result, the refractive index of the portion of the material irradiated with light is made larger relative to the refractive index of the periphery thereof, i.e., the light-unirradiated portion.

Further, in the case where a silicone oligomer is used, it is possible to use silicone oligomers not only with a photopolymerization initiator covalent-bonded thereto, but also with an agent acting as a cross-linking agent such as alkoxysilane or aminosilane, an epoxy or vinyl ether group exhibiting cationic polymerization characteristics, or an acrylic group exhibiting radical polymerization characteristics covalent-bonded thereto. After an organic solvent solution of such a resin material is filled in a gap between the optical element 5 and the substrate 1, light is applied to a predetermined portion of the material to achieve cross-linking, and then heating treatment is performed to decompose and remove unreacted portions of the photopolymerization initiator and the solution, so that the resin is cured by drying. As a result, the refractive index of the portion cross-linked by irradiation with light is made large relative to the refractive index of the periphery thereof, i.e., the light-unirradiated portion.

Still further, in the case where an acrylic oligomer is used, it is possible to use an acrylic oligomer mixture composed of a cross-linking agent added thereto, such as carbonyl compound, peroxide, azo compound, azide compound, bisazide compound, or diazo compopund; and a photopolymerization initiator. After an organic solvent solution of such a resin material is filled in a gap between the optical element 5 and the substrate 1, a predetermined portion of the material is irradiated with light to achieve cross-linking, and then heating treatment is performed to decompose and remove unreacted portions of the photopolymerization initiator and the solution, so that the resin is cured by drying. As a result, the refractive index of the portion cross-linked by irradiation with light is made large relative to the refractive index of the periphery thereof, i.e., the light-unirradiated portion.

As the photopolymerization initiator used here, conventionally-used photopolymerization initiators suffice for the purpose. The examples thereof include sulfonium salt, osmium salt, and antimonium salt.

In the underfill resin 7 in question, an optical guide structure is formed by a method whereby the refractive index of the pathway 10 irradiated with light is made larger than the refractive index of the periphery thereof. Specifically, after an organic solvent solution of the underfill resin 7 is filled in a gap between the optical element 5 and the substrate 1, light is introduced from one end of the optical waveguide 9 that is not connected to the optical element 5 so as to pass through the optical waveguide 9. The light then has its traveling direction changed by the mirror portion 8 so as to enter the optical element 5, whereby the resin is cross-link polymerized along the pathway 10 through which actually-transmitted light passes. Thereafter, heating treatment is performed so as for the underfill resin 7 to be cured by drying. In this way, in the underfill resin 7, the refractive index of the pathway 10 through which the actually-transmitted light passes is made larger than the refractive index of the periphery thereof. Moreover, at this time, by making the refractive index of the pathway 10 irradiated with light larger than the refractive index of the periphery thereof during light transmission, the light is guidedly transmitted through the portion having a larger refractive index and thus travels without being greatly diverted. As a result, an optical guide structure comes into existence on its own.

To impart satisfactory capability to the optical guide structure thus obtained, a degree of variation in refractive index is preferably set at 0.1% or above.

Moreover, light for use in irradiation is required to exert energy and intensity high enough to cross-link polymerize the resin, that is, to exert energy that acts on the photopolymerization initiator and the sensitizer contained in the resin. Specifically, ultraviolet light, visible light, and near-infrared light meet the demand. In particular, light having a wavelength (i.e., energy) close to that of light which is actually used for light-signal transmission is preferable. Because, by achieving cross-link polymerization with use of such light, the optical guide structure can be formed along a light transmission pathway similar to that used for the actual light-signal transmission, thereby forming the optical junction with efficiency.

Moreover, as the underfill resin 7 having the property that its light transmittability is increased by irradiation with light, a resin material may be used that contains: a monomer or oligomer with an organic component, such as a hydroxyl group, a vinyl group, a phenyl group, or a methyl group, attached thereto as a terminal group; and a photopolymerization accelerator, and lends itself to eliminate —OH or —CH causing absorption of near-infrared light by polymerization with dehydration or dealcoholization effected through irradiation with light.

For example, firstly, a solution for forming a siloxane polymer film is filled in a gap between the optical element and the substrate, which solution comprises a monomer or oligomer with an OH group and an organic component, e.g., an alkyl group such as mehtyl group or a phenyl group attached to an atom of silicon as terminal groups; a photoreactive polymerization accelerator; and an organic solvent. Thereafter, a predetermined portion of the solution is irradiated with light, so that siloxane linkages are formed by dehydration polymerization or dealcoholization polymerization. Subsequently, heating treatment is performed to discharge the solvent and the photopolymerization accelerator remaining in the material, as well as by-products of polymerization, such as water or alcohol, from the film obtained, and then the light-unirradiated portion is cured by drying. As a result, while the light-unirradiated portion absorbs light greatly because of —OH or —CH remaining therein that causes absorption of near-infrared light, the light-irradiated portion exerts high light transmittability because of decrease in —OH or —CH that causes absorption of near-infrared light.

In the underfill resin 7 in question, the optical guide structure can be formed by a method whereby the light transmittability of the pathway 10 irradiated with light is made higher than the light transmittability of the periphery thereof. Specifically, after the organic solvent solution of the underfill resin 7 is filled in a gap between the optical element 5 and the substrate 1, light is introduced from one end of the optical waveguide 9 that is not connected to the optical element 5 so as to pass through the optical waveguide 9. The light then has its traveling direction changed by the mirror portion 8 so as to enter the optical element 5, whereby the resin is cross-link polymerized along the pathway 10 through which actually-transmitted light passes. Thereafter, heating treatment is performed so as for the underfill resin 7 to be cured by drying. In this way, in the underfill resin 7, the light transmittability of the pathway 10 through which the actually-transmitted light passes is made higher than the light transmittability of the periphery thereof.

Note that, in a case where the upper clad portion 4 of the optical waveguide 9 is made thick enough to be impervious to light leakage, the underfill resin 7 for constituting an optical guide structure may be so designed that the refractive index of its portion covering the upper clad portion 4 is made larger than the refractive index of the upper clad portion 4.

PRACTICAL EXAMPLE

Figure 2:
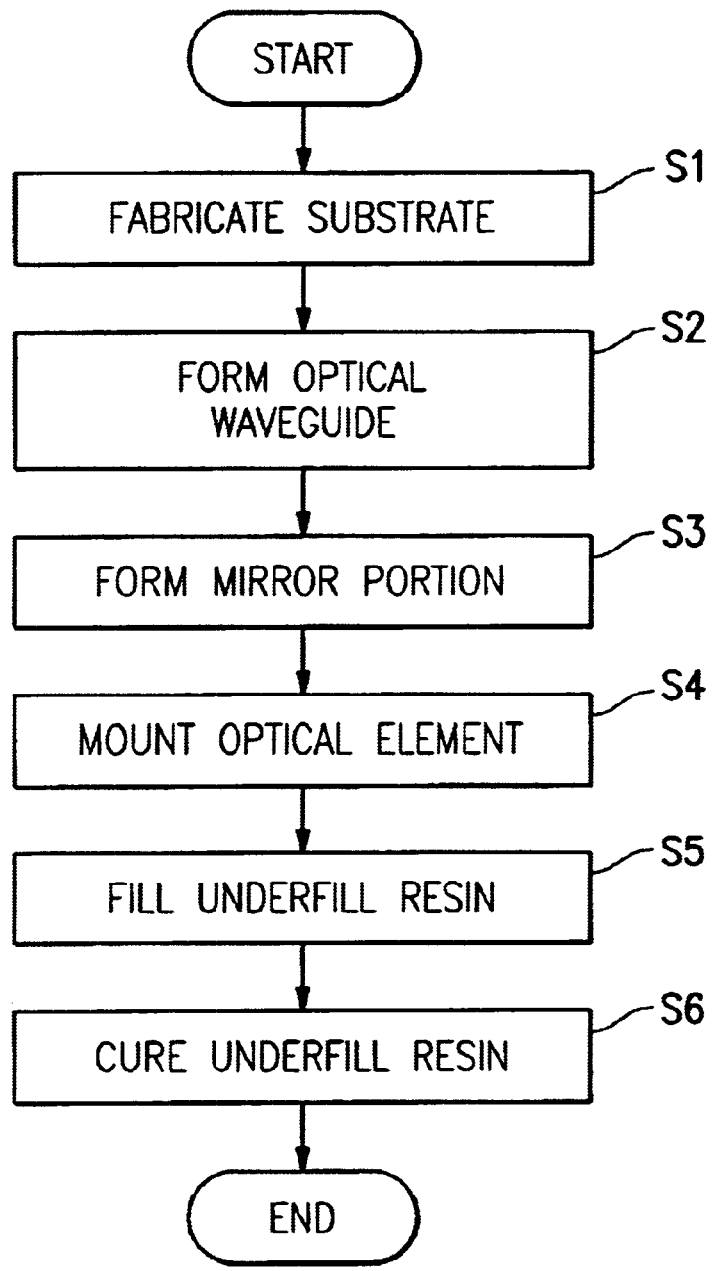
FIG. 2 is a flowchart showing a method for manufacturing the optical module of the invention.
Figure 3:
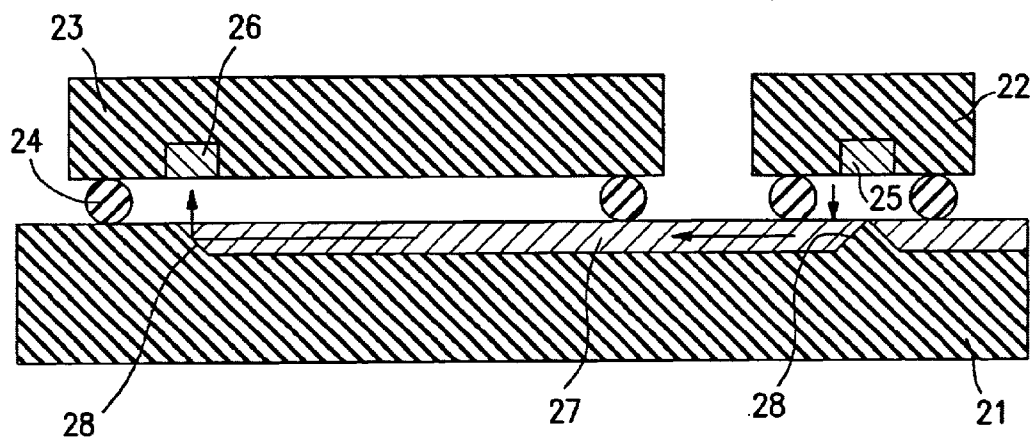
FIG. 3 is a sectional view showing an example of conventional optical modules.

Next, with reference to FIG. 2, a specific example of the optical module embodying the invention will be described.

Firstly, at step S1, onto an alumina substrate are formed an electric wiring layer made of 2 μm-thick Cu and a mounting pad used for placement of a conductor bump required to flip-chip mount an optical element 5, whereby an electric wiring substrate 1 is fabricated. The pad portion is plated with N1, then follow with 1 μm-thick Au as the topmost coat.

At step S2, the substrate 1 is spin-coated with an organic solvent solution of siloxane polymer, and is then heat-treated at 85° C. for 30 minutes and at 150° C. for 30 minutes, whereby a 12 μm-thick clad portion 2 (refractive index =1.4405 at λ=1.3 μm) is formed.

Then, the clad portion 2 is spin-coated with a mixed solution of siloxane polymer and tetra-n-butoxytitanium, and is then heat-treated at 85° C. for 30 minutes and at 150° C. for 30 minutes, whereby a 7 μm-thick core layer (refractive index=1.4450 at λ=1.3 μm) is formed.

Subsequently, a 0.5 μm thick Al film is formed onto the core layer by means of sputtering, and a photo resist pattern acting as a pattern for the core portion is formed by means of photolithography. Then, the Al film is subjected to etching with a mixed solution of phosphoric acid, acetatic acid, and nitric acid, whereby an Al pattern is formed onto which the resist-pattern is transferred.

After the resist is removed, the core portion 3 is etched by means of RIE processing with use of $CF_4$ gas and $O_2$ gas, whereby a core portion 3 7 μm wide and 7 μm high having an approximately rectangular section is formed.

Thereafter, the Al pattern is removed and, likewise to the above, a clad portion 4 (refractive index=1.4405 at λ=1.3 μm) is formed in which the core portion 2 is embedded, whereby a step-index type optical waveguide 9 is realized that has the clad portions 2 and 4 made of a siloxane polymer and the core portion 3 made of a titanium-containing siloxane polymer. The thickness of the upper clad portion 2 is determined such that the thickness of the entire optical waveguide 9 is set at 25 μm.

At step S3, a mirror portion 8 is formed as follows. Likewise as the core portion 3 of the optical waveguide 9, an Al film is formed, as a mask, that has an opening pattern acting as a mirror opening portion. Then, RIE processing is performed, whereby a slant surface acting as the mirror portion is formed. During the RIE processing, pressure and RF power are adequately adjusted so that the slant surface (the mirror portion 8) is inclined at an angle of 45 degrees. Then, the Al film is removed and an Au film is formed onto the slant surface serving as the mirror portion by means of Lift-off method.

Moreover, at the same time when the mirror slant surface is formed, the pad portion for use in mounting the optical element is opened.

At step S4, as the optical element 5, a surface light receiving type light-receiving element is mechanically and electrically coupled via a 100 μm-high Au bump 6 to the mounting pad formed on the substrate 1, with its light-receiving surface facing the substrate 1 side, by means of ultrasonic or thermal press-fitting.

The optical waveguide 9, the mirror portion 8, and the light-receiving element 5 are arranged so as for light having passed through the optical waveguide 9 and been deflected by the mirror portion 8 to enter the light-receiving region of the light-receiving element 5.

Then, the optical waveguide 9 is cut into separate base plates with use of a dicing blade so as for its one end connected to the light-receiving element 5 to be exposed at the end face of the substrate 1.

At step S5, a solution for forming an underfill resin is injected into a gap between the light-receiving element 5, and the optical wave guide 9 and the substrate 1 with use of a microsyringe which solution comprises a monomer with an OH group and mehtyl and phenyl groups attached to an atom of silicon as terminal groups; a photo-reactive polymerization accelerator; and an organic solvent. Then, at step S6, ultraviolet light emitted from a high-pressure mercury lamp, guided by an optical fiber, is introduced from the end portion of the optical waveguide 9 exposed at the end face of the substrate 1. The light is then deflected by the mirror portion 8 so as to be shone onto the light-receiving element 5, so that the pathway 10 of the underfill resin 7 through which the light passes undergoes exposure to light in order for the resin to be cross-link polymerized. Then, by performing heating treatment at 200° C. for 1 hour, the underfill resin 7 is cured by drying. As a result, an optical guide structure-is realized in which the light transmittability of the pathway radiated with light is higher than the light transmittability of the periphery thereof. The refractive index of the underfill resin is set at 1.4367.

The advantage of the practical example is that, because the refractive index of the underfill resin 7 is made smaller than the refractive index of the upper clad portion 4, light passing through the optical waveguide 9 never leaks to the underfill resin 7 located outside of the clad portions 2 and 4, thereby achieving satisfactory light transmission. This was confirmed by performing simulation based on Beam propagation method and by observing the near-field pattern of the section of the optical waveguide 9 cut up. Moreover, it was confirmed that, in the finished optical guide structure 10, with respect to light having a wavelength of 1.55 μm, while the portion formed by irradiation with ultraviolet-light so as to have higher light transmittability exhibits light transmittability of 0.1 dB/mm, the periphery thereof, i.e., the ultraviolet light-unirradiated portion exhibits light transmittability of 1 dB/mm, that is, the light passing through outside the optical guide structure 10 is attenuated.

It should be noted that the invention is not limited to the above-described embodiment and example and therefore various changes and modifications may be made without departing from the spirit or scope of the invention. For example, by using a resin material whose refractive index and light transmittability are increased by irradiation with light as the underfill resin, it is possible to realize an optical guide structure in which its light-irradiated portion exhibits larger refractive index and higher light transmittability than the periphery thereof.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. An optical module comprising:
    a substrate having an electric circuit formed thereon;
    a surface light receiving optical element or surface light emitting optical element flip-chip mounted on the substrate so that a light-receiving surface or light-emitting surface thereof faces the substrate side;
    an optical waveguide formed on the substrate, the optical waveguide having a core portion and a clad portion optically connected to the surface light receiving optical element or the surface light emitting optical element; and
    underfill resin filled in between the substrate and the light-receiving surface or between the substrate and the light-emitting surface, the underfill resin covering an optical junction between the surface light receiving optical element or the surface light emitting optical element and the optical waveguide,
    wherein the underfill resin is of an electrically insulating material and has a refractive index equal to or smaller than a refractive index of the clad portion of the optical waveguide.

2. The optical module of claim 1,
    wherein the underfill resin is of the type that refractive index thereof is increased by irradiation with light and has an optical guide structure formed by making a refractive index of a pathway irradiated with light coming from the optical waveguide side larger than a refractive index of a periphery thereof.

3. The optical module of claim 1,
    wherein the underfill resin is of the type that light transmittability thereof is increased by irradiation with light and has an optical guide structure formed by making a light transmittability of a pathway irradiated with light coming from the optical waveguide side higher than a light transmittability of a periphery thereof.

4. The optical module of claim 1,
    wherein the underfill resin comprises an elastomer resin, polyimide resin, epoxy resin, silicone resin, urethane resin, acrylic resin, fluorine resin, polyolefine resin, or any other polymer resin.

5. The optical module of claim 2,
    wherein the underfill resin comprises a resin material in which at least a matrix polymer contains a photopolymerization monomer and a photopolymerization accelerator.

6. The optical module of claim 3,
    wherein the underfill resin comprises a resin material containing a monomer or oligomer with an organic component attached thereto as a terminal group and a photopolymerization accelerator, the resin material being polymerized with dehydration or dealcoholization by being irradiated with light.

7. A method for manufacturing an optical module comprising the steps of:
    forming an optical waveguide having a core portion and a clad portion on a substrate on which an electric circuit is formed;
    flip-chip mounting a surface light receiving optical element or surface light emitting optical element on the substrate so that a light receiving surface or light, emitting surface thereof faces the substrate side; and
    filling and curing an underfill resin of an electrically insulating material and having a refractive index equal to or smaller than a refractive index of the clad portion of the optical waveguide, in between the substrate and the light-receiving surface or between the substrate and the light-emitting surface.

8. The method for manufacturing an optical module of claim 7,
    wherein the underfill resin is of the type that refractive index thereof is increased by irradiation with light and has an optical guide structure formed by making a refractive index of a pathway irradiated with light coming from the optical waveguide side larger than a refractive index of a periphery thereof.

9. The method for manufacturing an optical module of claim 7,
    wherein the underfill resin is of the type that light transmittability thereof is increased by irradiation with light and has an optical guide structure formed by making a light transmittability of a pathway irradiated with light coming from the optical waveguide side higher than a light transmittability of a periphery thereof.

10. The method for manufacturing an optical module of claim 7,
    wherein the underfill resin comprises an elastomer resin, polyimide resin, epoxy resin, silicone resin, urethane resin, acrylic resin, fluorine resin, polyolefine resin, or, any other polymer resin.

11. The method for manufacturing an optical module of claim 8,
    wherein the underfill resin comprises a resin material in which at least a matrix polymer contains a photopolymerization monomer and a photopolymerization accelerator.

12. The method for manufacturing an optical module of claim 9,
    wherein the underfill resin comprises a resin material containing a monomer or oligomer with an organic component attached thereto as a terminal group and a photopolymerization accelerator, the resin material being polymerized with dehydration or dealcoholization by irradiation with light.

* * * * *